United States Patent
Teng

(10) Patent No.: US 7,752,966 B2
(45) Date of Patent: *Jul. 13, 2010

(54) METHOD OF DEVELOPING LASER SENSITIVE LITHOGRAPHIC PRINTING PLATE

(76) Inventor: Gary Ganghui Teng, 10 Kendall Dr., Northborough, MA (US) 01532

( * ) Notice: Subject to any disclaimer, the term of this patent is extended or adjusted under 35 U.S.C. 154(b) by 577 days.

This patent is subject to a terminal disclaimer.

(21) Appl. No.: 11/787,878

(22) Filed: Apr. 17, 2007

(65) Prior Publication Data

US 2007/0196771 A1 Aug. 23, 2007

Related U.S. Application Data

(63) Continuation-in-part of application No. 11/266,817, filed on Nov. 4, 2005, now Pat. No. 7,213,516.

(51) Int. Cl.
*G03F 7/038* (2006.01)
(52) U.S. Cl. .............. 101/451; 101/450.1; 101/463.1; 101/465; 101/467; 430/270.1; 430/273.1
(58) Field of Classification Search ............ None
See application file for complete search history.

(56) References Cited

U.S. PATENT DOCUMENTS

| | | | |
|---|---|---|---|
| 5,607,816 A | 3/1997 | Fitzgerald et al. | 430/271.1 |
| 5,910,395 A | 6/1999 | Li et al. | 430/302 |
| 6,014,929 A | 1/2000 | Teng | 101/456 |
| 6,136,503 A | 10/2000 | Zheng et al. | 430/270.1 |
| 6,153,356 A | 11/2000 | Urano et al. | 430/281.1 |
| 6,232,038 B1 | 5/2001 | Takasaki et al. | 430/281.1 |
| 6,309,792 B1 | 10/2001 | Hauck et al. | 430/270.1 |
| 6,331,375 B1 | 12/2001 | Kawamura et al. | 430/270.1 |
| 6,482,571 B1 | 11/2002 | Teng | 430/302 |
| 6,576,401 B2 | 6/2003 | Teng | 430/303 |
| 6,689,537 B2 | 2/2004 | Urano et al. | 430/273.1 |
| 6,740,464 B2 | 5/2004 | Maemoto | 430/138 |
| 6,881,532 B2 | 4/2005 | Suzuki | 430/302 |
| 2003/0186165 A1 | 10/2003 | Gries et al. | 430/281.1 |

*Primary Examiner*—Judy Nguyen
*Assistant Examiner*—Joshua D Zimmerman

(57) ABSTRACT

A method of developing a laser sensitive lithographic printing plate with ink and/or fountain solution is described. The printing member comprises on a substrate a photosensitive layer soluble or dispersible in ink and/or fountain solution and capable of hardening upon exposure to a laser. The plate is exposed with a laser, deactivated, and then on-press developed with ink and/or fountain solution. Alternatively, the plate is developed with ink and/or fountain solution or the like off press, and then mounted on press for lithographic printing. The deactivation or off-press development allows the plate to be handled on press under white light or other light which is unsafe for a non-deactivated plate.

8 Claims, No Drawings

METHOD OF DEVELOPING LASER SENSITIVE LITHOGRAPHIC PRINTING PLATE

RELATED PATENT APPLICATIONS

This application is a continuation-in-part application of U.S. patent application Ser. No. 11/266,817 filed Nov. 4, 2005 now U.S. Pat. No. 7,213,516.

FIELD OF THE INVENTION

This invention relates to lithographic printing plates. More particularly, it relates to a method of deactivating or developing a laser sensitive lithographic plate after imagewise exposure and before printing on press.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation, optionally with further post-exposure overall treatment. In positive-working systems, the exposed areas become more soluble and can be developed to reveal the underneath substrate. In negative-working systems, the exposed areas become hardened and the non-exposed areas can be developed to reveal the underneath substrate. The exposed plate is usually developed with a liquid developer to bare the substrate in the non-hardened or solubilized areas.

On-press developable lithographic printing plates have been disclosed in the literature. Such plates can be directly mounted on press after exposure to develop with ink and/or fountain solution during the initial prints and then to print out regular printed sheets. No separate development process before mounting on press is needed. Among the patents describing on-press developable lithographic printing plates are U.S. Pat. Nos. 5,258,263, 5,516,620, 5,561,029, 5,616,449, 5,677,110, 5,811,220, 6,014,929, 6,071,675, and 6,482,571.

Laser sources have been increasingly used to imagewise expose a lithographic printing plate which is sensitized to a corresponding laser wavelength. Suitable lasers include infrared lasers (such as laser diode of about 830 nm and NdYAG laser of about 1064 nm), visible lasers (such as frequency-doubled NdYAG laser of about 532 nm, violet laser diode of about 405 nm), and ultraviolet laser (such as ultraviolet laser diode of about 350 to 370 nm). Among them, infrared laser diode, violet laser diode, and ultraviolet laser diode are most attractive.

Laser sensitive plates generally have higher sensitivity (than conventional film based plate) because of the limited laser power and the desire for fast imaging speed. Accordingly, photosensitive plates designed for laser imaging generally have limited room light stability. For example, before being developed to remove the non-hardened areas, frequency-doubled NdYAG laser sensitive plates usually require red room light for handling, violet laser sensitive plates usually require orange or yellow room light for handling, and infrared laser sensitive photopolymer plates usually require yellow room light for handling and have only limited white light stability (due to, for example, the use of certain initiator which has spectral sensitivity in the ultraviolet region).

Such limited room light stability is an inherent barrier for the design and use of laser sensitive lithographic plates. It would be desirable if the exposed laser sensitive plate can be treated or processed by a simple method so that it can be handled under white room light during on-press development and/or lithographic printing.

SUMMARY OF THE INVENTION

According to the present invention, there has been provided a method of lithographically printing images on a receiving medium, comprising in order:
  (a) providing a lithographic plate comprising (i) a substrate, and (ii) a photosensitive layer soluble or dispersible in ink and/or fountain solution and capable of hardening upon exposure to a laser having a wavelength selected from 200 to 1200 nm;
  (b) imagewise exposing said plate with said laser to cause hardening of the photosensitive layer in the exposed areas;
  (c) overall applying to the exposed plate (i) a deactivating agent, (ii) heat, or (iii) a radiation that has a different wavelength or different wavelengths from the laser and does not cause hardening of the photosensitive layer, to deactivate (without developing) the photosensitive layer; and
  (d) contacting said deactivated plate with ink and/or fountain solution on a lithographic press to remove the photosensitive layer in the non-hardened areas and to lithographically print images from said plate to the receiving medium.

Here the term "deactivate" means to make the photosensitive layer (in the non-hardened areas) incapable of photo hardening under a room light. The deactivated photosensitive layer (in the non-hardened areas) is incapable of photo hardening under a room light. The room light can be a white light, a yellow light or any other visible light, preferably a white light. The deactivation allows the plate to be handled and on-press developed freely under a room light which is not safe (causing hardening, at least after sufficient exposure to such room light) to the original, non-deactivated photosensitive layer, preferably under a white light. The deactivation process changes the property of the photosensitive layer (so that it becomes incapable of photo hardening), but does not develop (removing the non-hardened areas of) the photosensitive layer. It is noted that the property of the hardened areas of the photosensitive layer may also be changed by the deactivation process, but they remain hardened.

According to another aspect of the present invention, there has been provided a method of lithographically printing images on a receiving medium, comprising in order:
  (a) providing a lithographic plate comprising (i) a substrate; and (ii) a photosensitive layer soluble or dispersible in ink and/or fountain solution and capable of hardening upon exposure to a laser having a wavelength selected from 200 to 1200 nm;

(b) imagewise exposing said plate with a laser having a wavelength selected from 200 to 1200 nm to cause hardening of the photosensitive layer in the exposed areas;

(c) developing said exposed plate off press with ink and/or fountain solution, or with an organic solvent-based or oil-based liquid or paste and/or an aqueous solution, to remove the photosensitive layer in the non-hardened areas; and (d) mounting said developed plate on a lithographic press to lithographically print images from said plate to the receiving medium.

The off-press development allows a simple method of developing a plate without using a regular liquid developer that is generally hazardous. Upon off-press development, the plate can be handled freely under any light, including white light.

The plate can be under any lightings (including combination of different lightings) for certain amount of time for each of the steps (a) to (c) for both the above methods, as long as such exposures for the amount of time do not cause hardening of the photosensitive layer. The above step (d) for both the above methods can be performed with the plate under any light, preferably a white light. Here the term "with the plate under a light" means the plate is exposed to such light.

For both the above methods, preferably, said steps (a) to (c) are performed with the plate under lightings (including darkness) that will not cause hardening of the photosensitive layer at least within limited time under said lightings (preferably within 2 hours, more preferably within 30 minutes), and said step (d) is performed under a lighting that will cause hardening of the non-deactivated photosensitive layer; more preferably, said steps (a) to (c) are performed with the plate under lightings (including darkness) that will not cause hardening of the photosensitive layer, and said step (d) is performed under a lighting that will cause hardening of the non-deactivated photosensitive layer; most preferably, said steps (a) to (c) are performed with the plate under lightings that contain no or substantially no radiation below a wavelength selected from 400 to 650 nm (such as 400, 450, 500, 550, or 600 nm), or in darkness or substantial darkness, and said step (d) is performed under a white light. Here, the steps (a) to (c) can be under different or the same lightings (including darkness).

For both the above methods, the photosensitive layer exhibits an affinity or aversion substantially opposite to the affinity or aversion of the substrate to at least one printing liquid selected from the group consisting of ink and an abhesive fluid for ink. Preferably, the plate has a hydrophilic substrate and an oleophilic photosensitive layer.

DETAILED DESCRIPTION OF THE PREFERRED EMBODIMENTS

In this patent, the term yellow or red light means yellow light, red light, or any light with a color between yellow and red such as orange light. The term safe light means a light with a certain wavelength range being cut off, including yellow light or red light, so that it does not cause hardening of a certain photosensitive layer. The term white light means a white fluorescent light, a white incandescent light, sunlight, or any white office light. The term substantially no radiation below a wavelength means the intensity of the radiation below that wavelength is less than 1% of that for a regular 100-watt incandescent light (for home use, not focused) at a distance of 2 meters. The term substantial darkness means the intensity of the radiation is less than 1% of that for a regular 100-watt incandescent light at a distance of 2 meters. The term substantially light-tight means less than 1% of the room light can pass through. The term substantially all means at least 99%. The term "with the plate under a room light" means the plate is exposed to such room light; i.e., such room light reaches the plate. The term monomer includes both polymerizable monomer and polymerizable oligomer. The term (meth)acrylate includes acrylate and/or methacrylate (acrylate, methacrylate, or both acrylate and methacrylate). In calculating the weight ratio of the monomer to the polymeric binder, the weight of the monomer includes the total weight of all monomers and the weight of the polymeric binder includes the total weight of all polymeric binders.

The substrate employed in the lithographic plates of this invention can be any lithographic support. Such a substrate may be a metal sheet, a polymer film, or a coated paper. Aluminum (including aluminum alloy) sheet is a preferred metal support. Particularly preferred is an aluminum support that has been grained and anodized (with or without deposition of a barrier layer). Polyester film is a preferred polymeric film support. A surface coating may be coated to achieve desired surface properties. For wet plate, the substrate should have a hydrophilic or oleophilic surface, depending on the surface properties of the photosensitive layer (with opposite philicity to the substrate); preferably, a wet lithographic plate has a hydrophilic substrate and an oleophilic photosensitive layer. For waterless plate, the substrate should have an oleophilic or oleophobic surface, depending on the surface properties of the photosensitive layer (with opposite philicity to the substrate).

Particularly suitable hydrophilic substrate for a wet lithographic plate is an aluminum support that has been grained and anodized; such a substrate is preferably further deposited with a hydrophilic barrier layer. Surface graining can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic plate application are well known in the art, and examples can be found in U.S. Pat. Nos. 2,714,066, 4,153,461, 4,399,021, and 5,368,974. Suitable polymer film supports for a wet lithographic plate include a polymer film coated with a hydrophilic layer, preferably a hydrophilic layer that is crosslinked, as described in U.S. Pat. No. 5,922,502.

For preparing lithographic printing plates of the current invention, any photosensitive layer is suitable which is capable of hardening upon exposure to a laser having a wavelength selected from 200 to 1200 nm, and is soluble or dispersible in ink (for waterless plate) or in ink and/or fountain solution (for wet plate). Here hardening means becoming insoluble and non-dispersible in ink and/or fountain solution. Hardening is generally achieved through crosslinking or polymerization of the resins (polymers or monomers). A laser sensitive dye or pigment (preferably a sensitizing dye) is preferably added in the photosensitive layer. The photosensitive layer preferably has a coverage of from 100 to 4000 $mg/m^2$, and more preferably from 400 to 2000 $mg/m^2$.

Preferably, the photosensitive layer comprises a polymerizable monomer and an initiating system, optionally with addition of a polymeric binder. The initiating system generally comprises an initiator; an initiator and a sensitizing dye;

or an initiator, a sensitizing dye and a hydrogen donor; depending on the specific photosensitive layer. Either one species (such as 1 initiator or 1 polymer) or more than one species of the same component type (such as 2 different initiators or 3 different monomers) can be added in the same photosensitive layer. The composition ratios (such as monomer to polymer ratio) are usually different from conventional plates designed for development with a regular liquid developer. Various additives may be added to, for example, allow or enhance on-press developability. Such additives include surfactant, plasticizer, water soluble polymer or small molecule, and ink soluble polymer or small molecule. The addition of nonionic surfactant is especially helpful in making the photosensitive layer dispersible with ink and fountain solution, or emulsion of ink and fountain solution. Various additives useful for conventional photosensitive layer can also be used. These additives include pigment, dye, exposure indicator, and stabilizer.

Photosensitive materials useful in wet plates of this invention include, for example, photosensitive compositions comprising a polymerizable monomer, an initiator, a sensitizing dye, and optionally a polymer.

Photosensitive oleophobic materials useful in waterless plates of this invention include, for example, compositions comprising a monomer having perfluoroalkyl or polysiloxane groups and crosslinkable terminal groups, an initiator, and a sensitizing dye.

Infrared laser sensitive (also called thermosensitive) materials useful for wet lithographic plates of this invention include, for example, thermosensitive compositions comprising a polymerizable monomer, an initiator, an infrared absorbing dye, and optionally a polymer.

Visible or ultraviolet light sensitive materials useful for wet plates of this invention include, for example, photosensitive compositions comprising a polymerizable monomer, an initiator, a visible or ultraviolet light sensitizing dye, and optionally a polymer. A hydrogen donor is preferably added to accelerate the polymerization.

Polymeric binder for the photosensitive layer of this invention can be any solid film-forming polymer. The polymer may or may not have (meth)acrylate groups or other ethylenic groups (such as allyl groups). Examples of suitable polymers include (meth)acrylic polymers and copolymers (such as polybutylmethacrylate, polyethylmethacrylate, polymethylmethacrylate, polymethylacrylate, butylmethacrylate/methylmethacrylate copolymer, methylmethacrylate/methylmethacrylic acid copolymer, polyallylmethacrylate, and allylmethacrylate/methacrylic acid copolymer), polyvinyl acetate, polyvinyl butyrate, polyvinyl chloride, styrene/acrylonitrile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, polyurethane binder, and polymeric binder having polymer backbone with recurring units having pendant poly(alkylene glycol) side chains. The polymeric binder suitable for the photosensitive layer of this invention has a weight average molecular weight of at least 5,000, preferably from 10,000 to 1,000,000, more preferably from 20,000 to 500,000, and most preferably from 50,000 to 200,000 Dalton. It is noted that polymeric compounds with weight average molecular weight of less that 5,000 can also be added in the photosensitive layer of this invention; however, in order to avoid confusion, such compounds are not considered as polymeric binder and are called oligomer (without or with polymerizable groups) in this application (oligomers having polymerizable groups are also included in the definition of monomers in this application).

Suitable free-radical polymerizable monomers include any monomer or oligomer with at least one ethylenically unsaturated group. Such monomers include monofuctional, difunctional, and multifunctional (meth)acrylate monomers or oligomers, such as (meth)acrylate esters of ethylene glycol, trimethylolpropane, pentaerythritol, ethoxylated ethylene glycol and ethoxylated trimethylolpropane; multifunctional urethanated (meth)acrylate; epoxylated (meth)acrylate; and oligomeric amine (meth)acrylates. The monomers can be urethane (meth)acrylate, or non-urethane (meth)acrylate. Combination of both urethane (meth)acrylate and non-urethane (meth)acrylate monomers can be used. The monomers preferably has at least 3 (meth)acrylate groups, more preferably at least 4 (meth)acrylate groups, even more preferably at least 5 (meth)acrylate groups, and most preferably at least 6 (meth)acrylate groups. However, monofunctional or difunctional (meth)acrylate monomer can be added into the photosensitive layer having multifunctional (meth)acrylate monomers; the total amount of such monofunctional or difunctional monomers is preferably less than 50% by weight of the total monomers, more preferably less than 30%, and most preferably less than 10%. Acrylate monomer is preferred over methacrylate monomer because of the faster photospeed of acrylate group over methacrylate group. The monomer has a molecular weight of less than 5,000, preferably from 100 to 3,000, more preferably from 200 to 2,000, and most preferably from 300 to 1,500 Dalton.

Urethane (meth)acrylate monomers include any compounds having at least one urethane linkage (—NHCOO—) and at least one (meth)acrylate group. Preferred urethane (metha)acrylate monomers are those with at least 3 (meth)acrylate groups, more preferably at least 4 (meth)acrylate groups, even more preferably at least 5 (meth)acrylate groups, and most preferably at least 6 (meth)acrylate groups. Urethane (meth)acrylate monomer is usually formed by reacting a compound having at least one isocyanate group with a (meth)acrylate compound having a hydroxy group. Urethane monomer with 2 or more (meth)acrylate groups are usually formed from a compound having one or more isocyanate groups and a (meth)acrylate compound having a hydroxy group and one or more (meth)acrylate groups. For example, a tetrafunctional urethane (meth)acrylate monomer can be formed from a compound having one hydroxy group and 2 (meth)acrylate groups with a bifunctional isocyanate compound. Suitable isocyanate compounds include, for example, aromatic diisocyanate such as p-phenylene diisocyanate, 2,4-tolylene diisocyanate, 2,6-tolylene diisocyanate, 4,4'-diphenylmethane diisocyanate, naphthalene-1,5-diisocyanate and tolydine diisocyanate; aliphatic diisocyanate such as hexamethylene diisocyanate, lysinemethyl ester diisocyanate, 2,4,4-trimethylhexamethylene diisocyanate and dimer acid diisocyanate; alicyclic diisocyanate such as isophorone diisocyanate, and 4,4'-methylenebis(cyclohexylisocyanate); aliphatic diisocyanate having an aromatic ring, such as xylylene diisocyanate; triisocyanate such as lysine ester triisocyanate, 1,6,11-undecane triisocyanate, 1,8-diisocyanate-4-isocyanatemethyloctane, 1,3,6-hexamethylene triisocyanate, bicycloheptane triisocyanate, tris(isocyanate phenylmethane) and tris(isocyanatephenyl)thiophosphate; and polyisocyanate formed from condensation of three or more diisocyanate compounds such as 2,4-tolylene diisocyanate isocyanurate trimer, 2,4-tolylene diisocyanate-trimethylolpropane adduct, 1,6-hexanediisocyante isocyanurate trimer. Suitable (meth)acrylate compounds with one hydroxy group include pentaerythritol tri(meth)acrylate, dipentaerythritol penta(meth)acrylate, ditrimethylolpropane tri(meth)acrylate and pentaerythritol di(meth)acrylate monostearate. Various urethane (meth)acrylate monomers are described in U.S. Pat. No. 6,232,038 and U.S. Pat. Pub. No. 2002/0018962, and can be used as the urethane (meth) acrylate monomers of this instant invention. Among the urethane (meth)acrylate monomers, urethane acrylate monomer is preferred. Either aromatic urethane (meth)acrylate monomer (which contains at least one aromatic group in the molecule) or aliphatic urethane (meth)acrylate monomer (which does not contain any aromatic group in the molecule) or both can be used in a photosensitive layer of this invention.

Suitable non-urethane (meth)acrylate monomers can be any (meth)acrylate monomers without urethane linkage (—NHCOO—) in the molecule. Suitable non-urethane (meth)acrylate monomers include, for example, trimethylolpropane triacrylate, pentaerythritol tetra(meth)acrylate, dipentaerythritol penta(meth)acrylate, dipentaerythritol hexa (meth)acrylate, di(trimethylolpropane) tetra(meth)acrylate. Among the non-urethane (meth)acrylate monomers, non-urethane acrylate monomer is preferred.

Suitable free-radical initiators include, for example, the derivatives of acetophenone (such as 2,2-dimethoxy-2-phenylacetophenone, and 2-methyl-1-[4-(methylthio)phenyl]-2-morpholino propan-1-one), onium salts such as diaryliodonium hexafluoroantimonate, diaryliodonium hexafluorophosphate, diaryliodonium triflate, (4-(2-hydroxytetradecyl-oxy)phenyl)phenyliodonium hexafluoroantimonate, (4-octoxyphenyl)phenyliodonium hexafluoroantimonate, bis(4-t-butylphenyl)iodonium hexafluorophosphate, triarylsulfonium hexafluorophosphate, triarylsulfonium p-toluenesulfonate, (3-phenylpropan-2-onyl) triaryl phosphonium hexafluoroantimonate and N-ethoxy(2-methyl)pyridinium hexafluorophosphate, and the onium salts as described in U.S. Pat. Nos. 5,955,238, 6,037,098 and 5,629,354; borate salts such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and the borate salts as described in U.S. Pat. Nos. 6,232,038 and 6,218,076; haloalkyl substituted s-triazines such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis (trichloromethyl)-6-[(4-ethoxyethylenoxy)-phen-1-yl]-s-triazine, and the s-triazines as described in U.S. Pat. Nos. 5,955,238, 6,037,098, 6,010,824, and 5,629,354; titanocene compounds such as bis($\eta^9$-2,4-cyclopentadien-1-yl) bis[2,6-difluoro-3-(1H-pyrrol-1-yl)phenyl) titanium; hexaarylbiimidazole compounds such as 2,2'-bis(2-chlorophenyl)-4,4',5,5'-tetraphenyl-1,1'-biimidazole, 2,2'-bis(2-ethoxyphenyl)-4,4', 5,5'-tetraphenyl- 1,1'-biimidazole, 2-(1-naphthyl)-4,5-diphenyl-1,2'-biimidazole; and derivatives of acetophenone such as 2,2-dimethoxy-2-phenylacetophenone, and 2-methyl-1-[4-(methylthio)phenyl]-2-morpholino propan-1-one. Triarylsulfonium salts, diaryliodonium salts, and triarylalkylborate salts are preferred initiators for infrared laser sensitive plate. Titanocene compounds and hexaarylbiimidazole compounds are preferred initiators for visible or ultraviolet laser sensitive plate, and hexaarylbiimidazole compounds are more preferred. The initiator is added in the photosensitive layer preferably at 0.1 to 40% by weight of the photosensitive layer, more preferably 1 to 30%, and most preferably 5 to 20%.

Infrared sensitizing dyes useful in the thermosensitive layer of this invention include any infrared absorbing dye effectively absorbing an infrared radiation having a wavelength of 750 to 1200 nm. It is preferable that the dye has an absorption maximum between the wavelengths of 780 and 1100 nm. Various infrared absorbing dyes are described in U.S. Pat. Nos. 5,858,604, 5,922,502, 6,022,668, 5,705,309, 6,017,677, and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes. The infrared laser sensitizing dye is added in the photosensitive layer preferably at 0.1 to 20% by weight of the photosensitive layer, more preferably 0.5 to 10%, and most preferably 1 to 5%.

Visible or ultraviolet sensitizing dyes useful in the visible or ultraviolet sensitive photosensitive layer of this invention include any dyes having a wavelength maximum of from 200 to 600 nm. Suitable visible or ultraviolet sensitive dyes include, for example, cyanine dyes; rhodamine compounds such as rhodamine 6G perchloride; chromanone compounds such as 4-diethylaminobenzilidene chromanone; dialkylaminobenzene compounds such as ethyl 4-dimethylaminobenzoate and dialkylaminobenzene; dialkylaminobenzophenone compounds such as 4,4'-bis(dimethylamino)benzophenone, 4,4'-bis(diethylamino)benzophenone, 2-(p-dimethylaminophenyl)benzooxazole, 2-(p-diethylaminophenyl)benzooxazole, 2-(p-dimethylaminophenyl)benzo[4,5]benzooxazole, 2-(p-dimethylaminophenyl)benzo [6,7]benzooxazole, 2,5-bis(p-diethylaminophenyl) 1,3,4-oxazole, 2-(p-dimethylaminophenyl)benzothiazole, 2-(p-diethylaminophenyl)benzothiazole, 2-(p-dimethylaminophenyl)benzimidazole, 2-(p-diethylaminophenyl)benzimidazole, 2,5-bis(p-diethylaminophenyl)1,3,4-thiadiazole, (p-dimethylaminophenyl)pyridine, (p-diethylaminophenyl) pyridine, 2-(p-dimethylaminophenyl)quinoline, 2-(p-diethylaminophenyl)quinoline, 2-(p-dimethylaminophenyl)pyrimidine or 2-(p-diethylaminophenyl)pyrimidine; unsaturated cyclopentanone compounds such as 2,5-bis{[4-(diethylamino)phenyl]methylene}-(2E,5E)-(9Cl)-cyclopentanone and bis(methylindolenyl)cyclopentanone; coumarin compounds such as 3-benzoyl-7-methoxy coumarin and 7-methoxy coumarin; and thioxanthene compounds such as 2-isopropylthioxanthenone. Dialkylaminobenzene compounds and bis(dialkylamino)benzophenone compounds are particularly suitable for ultraviolet laser sensitive plate. Bis(dialkylamino)benzophenone compounds are particularly suitable for violet laser sensitive plate. The sensitizing dyes as described in U.S. Pat. Nos. 5,422,204 and 6,689,537, and U.S. Pat. App. Pub. No. 2003/0186165 can be used for the photosensitive layer of this invention. The visible or ultraviolet laser sensitizing dye is added in the photosensitive layer preferably at 0.1 to 20% by weight of the photosensitive layer, more preferably 0.5 to 15%, and most preferably 1 to 10%.

The free radical polymerizable photosensitive composition of the present invention can contain one or more hydrogen donors as a polymerization accelerator. Examples of the hydrogen donors include compounds having a mercapto group (also called mercapto compounds) such as 2-mercaptobenzothiazole, 2-mercaptobenzimidazole, 2-mercaptobenzoxazole and 3-mercapto-1,2,4-triazole; and N-aryl-α-amino acids, their salts and esters such as N-phenylglycine, salts of N-phenylglycine, and alkyl esters of N-phenylglycine such as N-phenylglycine ethyl ester and N-phenylglycine benzyl ester. Preferred hydrogen donors are 2-mercaptobenzothiazole, 2-mercaptobenzimidazole, 2-mercaptobenzoxazole, 3-mercapto-1,2,4-triazole, N-phenylglycine, N-phenylglycine ethyl ester, and N-phenylglycine benzyl ester. Combination of at least one mercapto compound and at least one N-aryl-α-amino acid or its ester or salt can be advantageously used in the photosensitive layer to increase the photospeed. The hydrogen donor is preferably added in the photosensitive layer at 0.01 to 15% by weight of the photosensitive layer, more preferably 0.1 to 10%, and most preferably 0.5 to 5%.

Various surfactants can be added into the photosensitive layer to allow or enhance the on-press developability with ink and/or fountain. Both polymeric and small molecule surfactants can be used. However, it is preferred that the surfactant has low or no volatility so that it will not evaporate from the photosensitive layer of the plate during storage and handling. Nonionic surfactants are preferred. The nonionic surfactant used in this invention should have sufficient portion of hydrophilic segments (or groups) and sufficient portion of oleophilic segments (or groups), so that it is at least partially soluble in water (>1 g surfactant soluble in 100 g water) and at least partially soluble in organic phase (>1 g surfactant soluble in 100 g photosensitive layer). Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 30% by weight of the photosensitive layer, more preferably from 0.5 to 20%, and most preferably from 1 to 15%.

The deactivating agent can be any compound that can deactivate the hardening capability of the photosensitive layer. The deactivating agent can be applied from a solution to the photosensitive layer (with or without overcoat). Preferably, the deactivating agent is soluble in water and is applied from an aqueous solution. Certain additives, such as dye, dispersed pigment, bactericide, stabilizer, reducer, thickening agent, cosolvent, and surfactant, can be added. For free radical polymerizable photosensitive layer, the deactivating agent can be a compound that can react with a component of the free radical initiating system (such as initiator, sensitizing dye, or hydrogen donor).

The solution containing the deactivating agent can be applied to the photosensitive layer of the plate through any means, such as spray, dipping, roller coating, slot coating, etc. For plate with an overcoat, the deactivating solution can be applied with or without the overcoat being removed first. When the overcoat is not removed before applying the deactivating solution, the deactivating solution may penetrate through the overcoat without removing the overcoat, or partially or completely remove the overcoat.

For photosensitive layer having an amine group in the initiator, sensitizing dye, or hydrogen donor, an acid compound (including organic acid and inorganic acid) can be used as the deactivating agent. Suitable organic acid include, for example, organic compounds having at lease one carboxylic acid group, a sulfonic acid group, or phosphonic acid group. Suitable inorganic acids include, for example, phosphoric acid, boric acid, and hydrochloride acid. Preferred acids are those with moderate acidity, such as carboxylic acid-functional organic compounds, phosphoric acid, and boric acid. Water-soluble organic compounds having at least one carboxylic acid group are preferred organic acids. Suitable organic acids include, for example, citric acid, acetic acid, salicylic acid, glycolic acid, malic acid, and lactic acid. Citric acid and malic acid are particularly suitable because they are widely used natural organic acids and are non-hazardous to the environment.

Alkaline solution can also be used as the deactivating agent because it can react with the free radical initiating system (initiator, sensitizing dye, or hydrogen donor) or monomer. Suitable alkaline compounds include, for example, sodium silicate, potassium silicate, sodium carbonate, and organic amines. Preferred alkaline compounds are water-soluble compounds with moderate basicity, such as sodium silicate, potassium silicate, ammonium hydroxide, and organic amines. Suitable water-soluble organic amines include regular amine compounds such as triethylamine, triethanolamine, 2-amino-2-methyl-1-propanol, tris(hydroxymethyl)aminomethane and N-methyl-2-pyrrolidone, and polymeric amines such as polyethyleneamine.

The latent deactivating agent can be any compound that can generate a deactivating agent at an elevated temperature of at least 70° C., preferably from 80 to 200° C., more preferably from 100 to 150° C. Suitable latent deactivating agents include any thermal acid generators capable of producing free acid at such elevated temperature. Various thermal acid generators have been described in the patent literature, such as U.S. Pat. Nos. 5,955,238, 6,037,098, and 6,159,655, and can be used as the thermal acid generator of the current invention. Examples of useful thermal acid generators are ammonium benzoate, and ammonium acetate.

The photosensitive layer may contain a compound that can react with a component in the initiating system (initiator, sensitizing dye and hydrogen donor) of the photosensitive layer at elevated temperature of at least 70° C., preferably from 80 to 200° C., more preferably from 100 to 150° C., causing deactivation of the photosensitive layer.

Photosensitive layer containing a thermally decomposable sensitizing dye or hydrogen donor can be deactivated by applying heat. The thermally decomposable sensitizing dye or hydrogen donor can be any sensitizing dye or hydrogen donor having a decomposition temperature of at least 70° C., preferably from 80 to 200° C., more preferably from 100 to 150° C. Here the decomposition temperature is a temperature at which the compound rapidly decomposes to two or more smaller compounds.

The heat can be applied to the plate by any means, such as hot air, contacting the back of the plate with a heated material, exposing the back of the plate with a radiation such as an infrared radiation, exposing the front of the plate (having photosensitive layer) with a radiation which has different wavelength from the laser and does not cause hardening of the photosensitive layer.

The photosensitive layer may be exposed with a radiation to cause deactivation of the photosensitive layer through photochemical reaction. Such radiation must have a different wavelength or different wavelengths from the laser and does not cause hardening of the photosensitive layer. The photosensitive layer can contain a latent deactivating agent which can generate a deactivating agent upon exposure to a radiation that has different wavelength from the laser and does not cause hardening of the photosensitive layer. Suitable photosensitive latent deactivating agent includes photo acid generators and photo base generators which can generate an acid or base upon exposure to a radiation different from the laser and does not cause hardening of the photosensitive layer.

For on-press developable plate comprising a water soluble overcoat capable of deactivation with heat or with a radiation, the overcoat can be removed on press with ink and/or fountain solution or removed after laser exposure and before on-press development. Preferably, the overcoat is removed with water after said laser exposure and before said deactivation.

For plates with rough and/or porous surface capable of mechanical interlocking with a coating deposited thereon, a thin water-soluble interlayer may be deposited between the substrate and the photosensitive layer. Here the substrate surface is rough and/or porous enough and the interlayer is thin enough to allow bonding between the photosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is the preferred water-soluble polymer. Usually pure water-soluble polymer is coated. However, one or more surfactant and other additives may be added. The water-soluble polymer is generally coated from an aqueous solution with water as the only solvent. A water-soluble organic solvent, preferably an alcohol such as ethanol or isopropanol, can be added into the water-soluble polymer aqueous coating solution to improve the coatability. The water-soluble organic solvent is preferably added at less than 20% by weight of the solution, more preferably at less than 10%. The releasable interlayer preferably has an average coverage of 1 to 200 $mg/m^2$, more preferably 2 to 100 $mg/m^2$, and most preferably 4 to 40 $mg/m^2$. The substrate preferably has an average surface roughness Ra of 0.2 to 2.0 microns, and more preferably 0.4 to 1.0 microns.

The photosensitive layer may be conformally coated onto a roughened substrate (for example, with Ra of larger than 0.4 microns) at thin coverage (for example, of less than 1.2 $g/m^2$) so that the plate can have microscopic peaks and valleys on the photosensitive layer coated surface and exhibit low tackiness and good block resistance, as described in U.S. Pat. No. 6,242,156, the entire disclosure of which is hereby incorporated by reference.

An ink and/or fountain solution soluble or dispersible overcoat can be coated on the photosensitive layer to, for example, improve the photospeed, surface durability, and/or developability of the plate. Preferred is a water soluble or dispersible overcoat. The overcoat preferably comprises a water-soluble polymer, such as polyvinyl alcohol (including various water-soluble derivatives of polyvinyl alcohol). Combination of two or more water-soluble polymers (such as a combination of polyvinyl alcohol and polyvinylpyrrolidone) may also be used. Polyvinyl alcohol is a preferred water-soluble polymer. Various additives, such as surfactant, wetting agent, defoamer, leveling agent and dispersing agent, can be added into the overcoat formulation to facilitate, for example, the coating or development process. Examples of surfactants useful in the overcoat of this invention include polyethylene glycol, polypropylene glycol, and copolymer of ethylene glycol and propylene glycol, polysiloxane surfactants, perfluorocarbon surfactants, alkylphenyl ethylene oxide condensate, sodium dioctylsulfosuccinate, sodium dodecylbenzenesulfonate, and ammonium laurylsulfate. Various organic or inorganic emulsion or dispersion may be added into the overcoat to, for example, reduce the tackiness or moisture sensitivity of the plate. The overcoat preferably has a coverage of from 0.001 to 4.0 $g/m^2$, more preferably from 0.01 to 2.0 $g/m^2$, and most preferably from 0.1 to 1.0 $g/m^2$.

In a preferred embodiment for the thermosensitive lithographic printing plate of this invention, the thermosensitive layer comprises a polymeric binder, a polymerizable ethylenically unsaturated monomer having at least one terminal ethylenic group, a free-radical initiator, and an infrared absorbing dye. Other additives such as surfactant, dye or pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added. The weight ratio of all the monomers to all the polymeric binders is preferably at least 1.0, more preferably at least 1.5, and most preferably at least 2.0.

In another preferred embodiment for the thermosensitive lithographic printing plates of this invention, the thermosensitive layer comprises a polymeric binder, a urethane (meth) acrylate monomer having at least 4 (meth)acrylate groups, a free-radical initiator, and an infrared absorbing dye.

In yet another preferred embodiment for the thermosensitive lithographic printing plates of this invention, the thermosensitive layer comprises a polymeric binder having polymer backbone with recurring units having pendant poly (alkylene glycol) side chains, a (meth)acrylate monomer having at least one (meth)acrylate group, a free-radical initiator, and an infrared absorbing dye.

In a preferred embodiment for visible light sensitive lithographic printing plates of this invention, the photosensitive layer comprises a polymeric binder, a polymerizable ethylenically unsaturated monomer having at least one terminal ethylenic group, a free-radical initiator, and a visible sensitizing dye. A hydrogen donor is preferably added to increase the photospeed. Other additives such as surfactant, dye or pigment, exposure-indicating dye, and free-radical stabilizer may be added. The weight ratio of all the monomers to all the polymeric binders is preferably at least 1.0, more preferably at least 1.5, and most preferably at least 2.0.

In a preferred embodiment for violet or ultraviolet light sensitive lithographic printing plates of this invention, the photosensitive layer comprises a polymeric binder, a polymerizable ethylenically unsaturated monomer having at least one terminal ethylenic group, a free-radical initiator, and a violet or ultraviolet sensitizing dye. A hydrogen donor is preferably added to increase the photospeed. Other additives such as surfactant, dye or pigment, exposure-indicating dye, and free-radical stabilizer may be added. The weight ratio of all the monomers to all the polymeric binders is preferably at least 1.0, more preferably at least 1.5, and most preferably at least 2.0.

In another preferred embodiment for the violet or ultraviolet laser sensitive lithographic plates of this invention, the photosensitive layer comprises a polymeric binder, a monomer having at least 3 (meth)acrylate group, a hexaarylbiimidazole or titanocene compound, a dialkylaminobenzophenone compound, and a hydrogen donor. The weight ratio of the all the monomers to all the polymeric binders is preferably at least 1.0, more preferably from 1.5 to 6.0, and most preferably from 2.0 to 5.0. A hexaarylbiimidazole compound is preferred among hexaarylbiimidazole and titanocene compounds. A preferred dialkylaminobenzophenone compound is a 4',4'-bis(dialkylamino)benzophenone compound.

In yet another preferred embodiment for the violet or ultraviolet laser sensitive lithographic plates of this invention, the photosensitive layer comprises a polymeric binder, a urethane monomer having at least 4 (meth)acrylate group, a hexaarylbiimidazole or titanocene compound, a dialkylaminobenzophenone compound, and a hydrogen donor. The weight ratio of the all the monomers to all the polymeric binders is preferably at least 0.5, more preferably from 1.0 to 6.0, and most preferably from 2.0 to 5.0. A hexaarylbiimidazole compound is preferred among hexaarylbiimidazole and titanocene compounds. A preferred dialkylaminobenzophenone compound is a 4,4'-bis(dialkylamino)benzophenone compound. A non-urethane (meth)acrylate monomer can be added.

In further another preferred embodiment for the violet or ultraviolet laser sensitive lithographic plates of this invention, the photosensitive layer comprises a polymeric binder, a urethane monomer having at least 4 (meth)acrylate group, a non-urethane monomer having at least 4 (meth)acrylate groups, a hexaarylbiimidazole or titanocene compound, a dialkylaminobenzophenone compound, and a hydrogen donor. The weight ratio of the urethane (meth)acrylate monomer to the non-urethane (meth)acrylate monomer is preferably from 0.10 to 10.0, more preferably from 0.20 to 5.0, and most preferably from 0.30 to 3.0. The weight ratio of all the monomers to all the polymeric binders is preferably at least 0.5, more preferably from 1.0 to 6.0, even more preferably from 1.5 to 5.0, and most preferably from 2.0 to 4.0. A hexaarylbiimidazole compound is preferred among hexaarylbiimidazole and titanocene compounds. A preferred dialkylaminobenzophenone compound is a 4,4'-bis(dialkylamino) benzophenone compound.

In yet further another preferred embodiment for the violet or ultraviolet laser sensitive lithographic plates of this invention, the photosensitive layer comprises a polymeric binder having polymer backbone with recurring units having pendant poly(alkylene glycol) side chains, a (meth)acrylate monomer having at least one (meth)acrylate group, a free-radical initiator, and a violet or ultraviolet sensitizing dye. A hydrogen donor is preferably added. Other additives such as surfactant, dye or pigment, exposure-indicating dye, and free-radical stabilizer may be added.

The on-press developable lithographic plates as described in U.S. Pat. Nos. 6,482,571, 6,576,401, 5,548,222, and 6,541,183, and U.S. patent application Ser. Nos. 10/720,882, 11/075,663 11/175,518, 11/266,817, 11/356,911, and 11/728,648, the entire disclosures of which are hereby incorporated by reference, can be used for the instant invention.

A hydrophilic or oleophilic micro particles may be added into the photosensitive layer to enhance, for example, the developability and non-tackiness of the plate. Suitable micro particles include polymer particles, talc, titanium dioxide, barium sulfate, silicone oxide, and aluminum micro particles, with an average particle size of less than 10 microns, preferably less than 5 microns, more preferably less than 2 microns, and most preferably less than 1 microns. A suitable particular dispersion is described in U.S. Pat. No. 6,071,675, the entire disclosure of which is hereby incorporated by reference.

The photosensitive layer should exhibit an affinity or aversion substantially opposite to the affinity or aversion of the substrate to at least one printing liquid selected from the group consisting of ink and an abhesive fluid for ink. For example, a wet plate can have a hydrophilic substrate and an oleophilic photosensitive layer, or can have an oleophilic substrate and a hydrophilic photosensitive layer; a waterless plate can have an oleophilic substrate and an oleophobic photosensitive layer, or can have an oleophobic substrate and an oleophilic photosensitive layer. An abhesive fluid for ink is a fluid that repels ink. Fountain solution is the most commonly used abhesive fluid for ink. A wet plate is printed on a wet press equipped with both ink and fountain solution, while a waterless plate is printed on a waterless press equipped with ink. Preferably, the plate is a wet plate and has a hydrophilic substrate and an oleophilic photosensitive layer.

Infrared lasers useful for the imagewise exposure of the thermosensitive plates of this invention include laser sources emitting in the near infrared region, i.e. emitting in the wavelength range of from 750 to 1200 nm, and preferably from 800 to 1100 nm. Particularly preferred infrared laser sources are laser diodes emitting around 830 nm or a NdYAG laser emitting around 1060 nm. The plate is exposed at a laser dosage that is sufficient to cause hardening in the exposed areas but not high enough to cause substantial thermal ablation. The exposure dosage is preferably from 1 to 400 $mJ/cm^2$, more preferably from 5 to 200 $mJ/cm^2$, and most preferably from 20 to 150 $mJ/cm^2$, depending on the sensitivity of the thermosensitive layer.

Visible lasers useful for the imagewise exposure of the visible light sensitive plates of this invention include any laser emitting in the wavelength range of from 390 to 600 nm. Examples of suitable visible lasers include frequency-doubled Nd/YAG laser (about 532 nm), argon ion laser (about 488 nm), violet diode laser (about 405 nm), and visible LEDs. Violet laser diode is especially useful because of its small size and relatively lower cost. The exposure dosage is preferably from 0.0001 to 5 $mJ/cm^2$ (0.1 to 5000 $\mu F/cm^2$), more preferably from 0.001 to 0.5 $mJ/cm^2$ (1 to about 500 $\mu J/cm^2$), and most preferably from 0.005 to 0.10 $mJ/cm^2$ (5 to 100 $\mu J/cm^2$), depending on the sensitivity of the photosensitive layer.

Ultraviolet lasers useful for the imagewise exposure of the ultraviolet light sensitive plates of this invention include any laser having a wavelength of from 200 to 390 nm. Examples of ultraviolet lasers include ultraviolet diode lasers or LEDs having a wavelength of from 350 to 390 nm. Laser diodes are preferred ultraviolet lasers. The exposure dosage is preferably from 0.0001 to 5 $mJ/cm^2$ (0.1 to 5000 $\mu J/cm^2$), more preferably from 0.001 to 0.5 $mJ/cm^2$ (1 to about 500 $\mu J/cm^2$), and most preferably from 0.005 to 0.10 $mJ/cm^2$ (5 to 100 $\mu J/cm^2$), depending on the sensitivity of the photosensitive layer.

Among the visible and ultraviolet lasers, violet or ultraviolet laser with a wavelength selected from 200 to 430 nm, preferably from 300 to 430 nm, is particularly useful.

Laser imaging devices are currently widely available commercially. Any device can be used which provides imagewise laser exposure according to digital imaging information. Commonly used imaging devices include flatbed imager, internal drum imager, and external drum imager, all of which can be used for the imagewise laser exposure in this invention.

For on-press development, the plate is exposed on an exposure device, deactivated with a deactivating agent, and then mounted on press to develop with ink and/or fountain solution and then print out regular printed sheets. The ink and/or fountain solution solubilized or dispersed photosensitive layer and/or overcoat can be mixed into the ink and/or the fountain solution on the rollers, and/or can be transferred to the blanket and then the receiving medium (such as paper). The fountain solution roller is engaged (to the plate cylinder as for conventional inking system or to the ink roller as for integrated inking system) for preferably 0 to 100 rotations, more preferably 1 to 50 rotations and most preferably 5 to 20 rotations (of the plate cylinder), and the ink roller is then engaged to the plate cylinder for preferably 0 to 100 rotations, more preferably 1 to 50 rotations and most preferably 5 to 20 rotations before engaging the plate cylinder and feeding the receiving medium. Good quality prints should be obtained preferably under 40 initial impressions, more preferably under 20 impressions, and most preferably under 5 impressions.

For conventional wet press, usually fountain solution is applied (to contact the plate) first, followed by contacting with ink roller. For press with integrated inking/dampening system, the ink and fountain solution are emulsified by various press rollers before being transferred to the plate as emulsion of ink and fountain solution. However, in this invention, the ink and fountain solution may be applied at any combination or sequence, as needed for the plate. There is no particular limitation. The recently introduced single fluid ink that can be used for printing wet lithographic plate without the use of fountain solution, as described in for example U.S. Pat. No. 6,140,392, can also be used for the on-press development and printing of the plate of this invention.

The ink used in this application can be any ink suitable for lithographic printing. Most commonly used lithographic inks include "oil based ink" which crosslinks upon exposure to the oxygen in the air and "rubber based ink" which does not crosslink upon exposure to the air. Specialty inks include, for example, radiation-curable ink and thermally curable ink. An ink is an oleophilic, liquid or viscous material which generally comprises a pigment dispersed in a vehicle, such as vegetable oils, animal oils, mineral oils, and synthetic resins. Various additives, such as plasticizer, surfactant, drier, drying retarder, crosslinker, and solvent may be added to achieve certain desired performance. The compositions of typical lithographic inks are described in "The Manual of Lithography" by Vicary, Charles Scribner's Sons, New York, and Chapter 8 of "The Radiation Curing: Science and Technology" by Pappas, Plenum Press, New York, 1992.

The fountain solution used in this application can be any fountain solution used in lithographic printing. Fountain solution is used in the wet lithographic printing press to dampen the hydrophilic areas (non-image areas), repelling ink (which is hydrophobic) from these areas. Fountain solution contains mainly water, generally with addition of certain additives such as gum arabic and surfactant. Small amount of alcohol such as isopropanol can also be added in the fountain solution. Water is the simplest type of fountain solution. Fountain solution is usually neutral to mildly acidic. However, for certain plates, mildly basic fountain solution is used. The type of fountain solution used depends on the type of the plate substrate as well as the photosensitive layer. Various fountain solution compositions are described in U.S. Pat. Nos. 4,030,417 and 4,764,213.

Emulsion of ink and fountain solution is an emulsion formed from ink and fountain solution during wet lithographic printing process. Because fountain solution (containing primarily water) and ink are not miscible, they do not form stable emulsion. However, emulsion of ink and fountain solution can form during shearing, compressing, and decompressing actions by the rollers and cylinders, especially the ink rollers and plate cylinder, on a wet lithographic press. For wet press with integrated inking system, ink and fountain solution are emulsified on the ink rollers before transferred to the plate.

For off-press development with ink and/or fountain solution, or with an organic solvent- or oil-based liquid or paste and/or an aqueous solution, a developing device which carries ink and/or fountain solution, or an organic solvent- or oil-based liquid or paste and/or an aqueous solution, can be used. Preferably, the plate is developed with (i) ink, (ii) both ink and fountain solution, (iii) an organic solvent-based or oil-based liquid or paste (preferably an organic solvent-based or oil-based paste), or (iv) both an organic solvent- or oil-based liquid or paste and an aqueous solution, and the device carries corresponding developing fluid or fluids (i, ii, iii, or iv). For plate developable with ink, a regular ink or single-fluid ink can be used.

For plate requiring more than one developing fluid (including paste), the ink (or the solvent- or oil-based liquid or paste) and the fountain solution (or the aqueous solution) can be applied by any means and at any sequence or combination. The same developing fluid may be applied more than once, and different compositions of the same type of fluid (such as different aqueous solutions) can be used in the same developing device. Preferably, the fountain solution (or the aqueous solution) is applied first (for example, by spray, dipping, roller coating, or slot coating) to dampen the plate, followed by applying ink (for example, with one or more ink rollers) to remove the photosensitive layer in the non-hardened areas. After applying ink, the plate may be further applied with the fountain solution (or the aqueous solution) or a gum solution (plate finisher), to further clean the background areas and/or to protect the lithographic surface of the plate. For plate with a water soluble or dispersible overcoat, the overcoat can be removed by contacting with fountain solution or the aqueous solution during the off-press development. Alternatively, the overcoat can be removed by rinse with water or other aqueous solution in a separate step before the development.

The organic solvent- or oil-based liquid or paste can be any liquid or paste materials with organic solvent or oil as the main solvent, which can dissolve or disperse (and therefore develop) the photosensitive layer of this invention. Ink is one of such materials. The liquid or paste may or may not contain pigment or dye. The oil can be a petroleum oil, vegetable oil, animal oil, or synthetic oil. The aqueous solution can be any water-based solutions that can dampen the substrate surface of the plate, or can be water. Fountain solution is one of such aqueous solutions. The aqueous solution can be neutral, slight acidic, or slightly basic, preferably with a pH of 4.0 to 10.0, more preferably 5.0 to 9.0, and most preferably 6.0 to 8.0.

For plate with a water soluble or dispersible overcoat, the plate can be rinsed with water or other aqueous solution, to remove the water soluble or dispersible overcoat after imagewise exposure and before deactivation or off-press development.

The laser exposure, and deactivation or off-press development of this invention can be performed with the plate under any lightings (or darkness) for certain amount of time, as long as the exposures to such lightings for such amount of time will not cause hardening of the photosensitive layer; such lighting can be a yellow or red light for limited or unlimited time (preferably limited time, more preferably less than 120 minutes, and most preferably less than 30 minutes), darkness or substantial darkness, or white light for limited time (preferably less than 60 minutes, more preferably less than 20 minutes, and most preferably less than 5 minutes). Preferably, the laser exposure, and deactivation or off-press development are performed with the plate under lightings (or darkness) that will not cause hardening of the photosensitive layer; more preferably, under lightings containing no or substantially no radiation below a wavelength selected from 400 to 650 nm (such as 500 nm), or in darkness or substantial darkness; and most preferably under lightings containing no radiation below a wavelength selected from 400 to 650 nm, or in darkness. The lighting containing no or substantially no radiation below a wavelength selected from 400 to 650 nm (such as 500 nm) is usually a yellow or red light. This includes a light that is from a fluorescent or incandescent lamp covered with a filter that cuts off all or substantially all (at least 99%) of the radiation below a wavelength selected from 400 to 650 nm; preferably the lamp is covered with a filter that cuts off all of the radiation below a wavelength selected from 400 to 650 nm. The laser exposure and the deactivation or off-press development can be performed with the plate under the same or different lightings.

The plate can be imaged on a laser imager and deactivated with a deactivating device or off-press developed with a developing device, preferably in a room which has a lighting that contains no or substantially no radiation below a wavelength selected from 400 to 650 nm. The plate can be manually or automatically handled between the imager and deactivating device or developing device. The imager and deactivating or developing device can stay open to the room light. Alternatively, the plate can be packaged in a substantially light-tight cassette to feed to the exposure device that is designed to be substantially light-tight for the plate, with the plate covered with substantially light-tight covers. The plate can be automatically transferred to the deactivating device or the off-press developing device, with the plate staying within the substantially light-tight covers all or substantially all the time until it has been deactivated or off-press developed. The room lighting can be a white light. Further alternatively, the above automatic processes can be designed so that the substantially light-tight covers have some light-filtering windows which only passes radiation above a wavelength selected from 400 to 650 nm (such as 500 nm), so that the operator can visually monitor the plate during imaging and deactivation or off-press development.

In a first preferred embodiment for the lighting of the invention, the laser exposure, and deactivation or off-press development are performed with the plate under lightings (including darkness) that will not cause hardening of the photosensitive layer, and the on-press development or lithographic printing is performed under a lighting that will cause hardening of the non-deactivated photosensitive layer.

In a second preferred embodiment for the lighting of the invention, the laser exposure, and deactivation or off-press development are performed with the plate under lightings that contain no or substantially no radiation below a wavelength selected from 400 to 650 nm (such as 400, 450, 500, 550, or 600 nm), and/or in darkness or substantial darkness; and the on-press development or lithographic printing is performed under a white light. Here, the steps can be under different or the same lightings (including darkness).

In a third preferred embodiment for the lighting of the invention, the laser exposure, and deactivation or off-press development are performed with the plate under yellow or red lights, and/or in darkness or substantial darkness; and the on-press development or lithographic printing is performed under a white light. Here, the steps can be under different or the same lightings (including darkness).

In a fourth preferred embodiment for the lighting of the invention, the plate is under the same room lighting for the laser exposure, and deactivation or off-press development, and the total exposure time to the room lighting before the plate being deactivated is short enough so that the non-imagewise-exposed areas of the plate are not hardened (still capable of development with ink and/or fountain solution). The room lighting can be any light that will cause hardening of the photosensitive layer if exposed to the lighting for more than a certain amount of time (such as 20 minutes). Preferably, the room lighting is a white light, the plate is stable (not causing hardening) under said white light for at least 5 minutes, and the total exposure time to the room light before deactivation or off-press development is less than 60 minutes, more preferably less than 20 minutes, and most preferably less than 5 minutes. The plate can be open to the room light all the time, or open to the room light part of the time and shielded with covers the rest of the time, during the imaging, deactivation or off-press development, and handling before the plate being deactivated or off-press developed.

In a fifth preferred embodiment for the lighting of the instant invention, both the laser exposure and deactivation or off-press development are performed with the plate under a lighting that contains no or substantially no radiation below a wavelength selected from 400 to 650 nm; the lightings for the laser exposure and deactivation or off-press development can be the same or different.

In a sixth preferred embodiment for the lighting of this invention, the laser exposure is performed with the plate under a lighting that contains no or substantially no radiation below a wavelength selected from 400 to 650 nm and the deactivation or off-press development is performed with the plate in darkness or substantial darkness (preferably shielded with substantially light-tight covers).

In a seventh preferred embodiment for the lighting of this invention, the laser exposure is performed with the plate in darkness or substantial darkness (preferably shielded with substantially light-tight covers) and the deactivation or off-press development is performed with the plate under a lighting that contains no or substantially no radiation below a wavelength selected from 400 to 650 nm.

In an eighth preferred embodiment for the lighting of this invention, both the laser exposure and the deactivation or off-press development are performed with the plate in darkness or substantial darkness. Preferably, the plate is shielded with covers which prevent all or substantially all room light from reaching the plate during the laser exposure and the deactivation or off-press development.

This invention is further illustrated by the following examples of its practice.

EXAMPLES 1-3

An electrochemically grained, anodized, and polyvinylphosphonic acid treated aluminum sheet was first coated with a 0.1% aqueous solution of polyvinyl alcohol (Airvol 540, from Air Products) with a #6 Meyer rod, followed by drying in an oven at 100° C. for 2 min. The polyvinyl alcohol coated substrate was further coated with the photosensitive layer formulation PS-1 with a #8 Meyer rod, followed by drying in an oven at 90° C. for 2 min.

| PS-1 | |
|---|---|
| Component | Weight ratios |
| Neocryl B-728 (Polymer from Zeneca) | 2.75 |
| DPHA (Acrylic monomer from UCB Chemicals) | 6.56 |
| Pluronic L43 (Nonionic surfactant from BASF) | 0.56 |
| 2,2-Bis(2-chlorophenyl)-4,4',5,5'-tetraphenyl-1,1'-biimidazole | 1.21 |
| 4,4'-Bis(diethylamino)benzophenone | 0.77 |
| 2-Mercaptobenzoxazole | 0.15 |
| 2-Butanone | 88.00 |

The photosensitive layer coated plate was further coated with a water-soluble overcoat OC-1 using a #6 Meyer rod, followed by drying in an oven at 100° C. for 2 min. All the coatings were performed under a red light and the plate was then stored in a light tight box.

| OC-1 | |
|---|---|
| Component | Weight (g) |
| Airvol 203 (polyvinyl alcohol from Air Products) | 4.84 |
| Silwet 7604 (Surfactant from Union Carbide) | 0.02 |
| Triton X-100 (Surfactant from www.chemistrystore.com) | 0.14 |
| Water | 95.00 |

The plate was exposed with a violet plate imager equipped with a 60 mw violet laser diode emitting at about 405 nm (MAKO-8 from ECRM) for a dosage of about 90 μJ/cm². The plate was imaged in an orange light room (with Fuji Yellow FV30 lights from Encapsulite), and was kept in a light tight box before and after imaging.

The laser exposed plate was cut into 3 pieces under red light. The first piece was treated with a 5% citric acid aqueous solution by dipping in the solution for 10 seconds. The second piece was rinsed with water by dipping in water for 5 seconds to remove the overcoat. The third piece was not treated. The treatments were performed under red light.

Each of the treated plates was tested on a wet lithographic press (AB Dick 360) under office (white) fluorescent light. The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. The printed sheets were evaluated for on-press developability of the plate, with the results summarized in Table 1.

TABLE 1

| Treatment of the plate | Background at 20 impressions | Background at 200 impressions | Inking in imaging areas |
|---|---|---|---|
| Dip in a 5% citric acid aqueous solution | Clean | Clean | Good |
| Rinse with water | Toning Inked | Toning Inked | Good |
| No treatment | Inked | Inked | Good |

EXAMPLE 4

An electrochemically grained, anodized, and silicate treated aluminum sheet was coated with the photosensitive layer formulation PS-1 with a #6 Meyer rod, followed by drying in an oven at 90° C. for 2 min. The photosensitive layer coated plate was further coated with a water-soluble overcoat OC-1 using a #6 Meyer rod, followed by drying in an oven at 100° C. for 2 min. The plate was prepared under a red light and then stored in a light tight box.

The plate was exposed with a violet plate imager equipped with a 60 mw violet laser diode emitting at about 405 nm (MAKO-8 from ECRM) for a dosage of about 90 μJ/cm². The plate was imaged in an orange light room, and was kept in a light tight box before and after imaging.

While under a red light, the laser-exposed plate was rubbed for 10 times for all areas with a cloth soaked with both ink and fountain solution. The exposed areas were well inked, and the non-exposed areas were free of ink.

The developed plate was mounted on a lithographic press (AB Dick 360) under office fluorescent light to print to 200 impressions. The printed sheets all showed good inking in the exposed areas and clean background in the non-exposed areas.

I claim:

1. A method of lithographically printing images on a receiving medium, comprising in order:
    (a) providing a lithographic plate comprising (i) a substrate, and (ii) a photosensitive layer capable of hardening upon exposure to a laser having a wavelength selected from 750 to 1200 nm and soluble or dispersible in ink and/or fountain solution;
    (b) imagewise exposing said plate with the laser to cause hardening of the photosensitive layer in the exposed areas;
    (c) overall applying to said exposed plate a radiation that has a different wavelength or different wavelengths from the laser and does not cause hardening of the photosensitive layer, to deactivate the photosensitive layer; and
    (d) developing said deactivated plate with ink and/or fountain solution on a lithographic press to remove the photosensitive layer in the non-hardened areas and to lithographically print images from said plate to the receiving medium.

2. The method of claim 1 wherein said steps (a) to (c) are performed with the plate under lightings that contain no or substantially no radiation below a wavelength selected from 400 to 650 nm, or in darkness or substantial darkness; and said step (d) is performed with the plate under a white light.

3. The method of claim 1 wherein said plate is under a room light for at least a portion of said steps (b) and (c), and the total exposure time to said room light before said plate being deactivated is short enough so that the non-imagewise-exposed areas of said plate are not hardened.

4. The method of claim 1 wherein said plate is under a white room light for at least a portion of said steps (b) to (c) and for all said step (d), and the total exposure time to said white room light before said plate being deactivated is short enough so that the non-imagewise-exposed areas of said plate are not hardened.

5. The method of claim 1 wherein said steps (b) and (c) are performed with the plate being shielded with covers which prevent all or substantially all room light from reaching said plate; and said step (d) is performed with the plate under a white room light.

6. The method of claim 1 wherein said photosensitive layer comprises a free radical polymerizable monomer, a free radical initiator, and a sensitizing dye.

7. The method of claim 1 wherein said plate further comprises an ink and/or fountain solution soluble or dispersible overcoat.

8. The method of claim 1 wherein said substrate is hydrophilic and said photosensitive layer is oleophilic.

* * * * *